United States Patent
Bhavnagarwala et al.

(10) Patent No.: US 6,839,299 B1
(45) Date of Patent: Jan. 4, 2005

(54) METHOD AND STRUCTURE FOR REDUCING GATE LEAKAGE AND THRESHOLD VOLTAGE FLUCTUATION IN MEMORY CELLS

(75) Inventors: Azeez J. Bhavnagarwala, Newtown, CT (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/625,959

(22) Filed: Jul. 24, 2003

(51) Int. Cl.[7] .................................................. G11C 7/00
(52) U.S. Cl. ............. 365/226; 365/185.16; 365/185.24; 365/228; 365/188
(58) Field of Search ........................ 365/226, 185.16, 365/185.24, 228, 188

(56) References Cited

U.S. PATENT DOCUMENTS

| | | | | |
|---|---|---|---|---|
| 4,980,859 A | * | 12/1990 | Guterman et al. ..... | 365/185.08 |
| 5,748,530 A | * | 5/1998 | Gotou et al. ........... | 365/185.18 |
| 6,069,519 A | * | 5/2000 | Song ..................... | 365/185.18 |
| 6,639,827 B2 | * | 10/2003 | Clark et al. ............ | 365/189.11 |

* cited by examiner

*Primary Examiner*—Richard Elms
*Assistant Examiner*—Tuan T. Nguyen
(74) *Attorney, Agent, or Firm*—Keusey, Tutunjian & Bitetto, P.C.; Louis J. Percello

(57) ABSTRACT

A memory device has a memory cell including a plurality of active devices, which can be switched on by an applied threshold voltage. A power line is coupled to at least one storage node by one of the active devices. One other of the active devices couples a virtual ground to the storage node. Potentials of the power line and the virtual ground cause the plurality of active devices to be selectively operated in near subthreshold and/or superthreshold regimes in accordance with a mode of operation.

25 Claims, 3 Drawing Sheets

METHOD AND STRUCTURE FOR REDUCING GATE LEAKAGE AND THRESHOLD VOLTAGE FLUCTUATION IN MEMORY CELLS

BACKGROUND OF THE INVENTION

1. Field of the Invention

The present invention relates to random access memory technology and architecture, and more particularly to reducing gate leakage and threshold voltage fluctuation in memory cells by employing threshold voltages in a plurality of operational regimes.

2. Description of the Related Art

Static memory storage devices are subjected to more constraints at low voltages. With the portability of active or switching memory devices, power becomes a greater concern with higher performance requirements since power levels are generally lower and limited by portable power storage devices. These difficulties make the design of storage cells for portable applications more challenging.

Static random access memories (SRAM) typically include a cell including six transistors that stores data and can be read from and written to without a refresh cycle. SRAM may be employed in high performance applications e.g., in caches, microprocessors, memory buffers in ASICs, etc.

Designing complementary metal oxide semiconductor (CMOS) static random access memory (SRAM) cells for high performance becomes particularly challenging at low power supply voltages, which are typically employed for portable applications. The data stored in a cell becomes increasingly vulnerable to a read upset and other stability problems at these low power voltages. In addition, the scalability of the supply voltage is also limited for conventional CMOS SRAM cells, due to dopant fluctuations in small-geometry cell transistors.

Exponentially increasing leakage, higher demands on SRAM performance at lower operating voltages and data retention stability in the presence of severe threshold voltage fluctuations are performance issues of newer generations of SRAM devices.

These issues were typically addressed by providing lower supply voltages for transistor gates and/or thicker gate oxide thicknesses. However, lower supply voltages may result in data stability problems, and as a result lower performance (slower, etc.) are experienced in SRAM cells. In addition, thicker gate oxides result in severe short channel effects, i.e., the gate exercises less control in its ability to turn off the transistor.

As devices shrink, tunneling currents across gate oxides increase exponentially by scaling to small geometries, e.g., gate oxide thickness. Furthermore, as the device geometries shrink, the number of impurity atoms decreases and as a result their statistical variation in number and position increases; hence, reducing the numbers of electron donors or acceptors in the smaller geometry (structure).

Bulk charge contributes to the threshold voltage of a MOSFET device, and fluctuates with respect to the number of doping atoms/impurities in the device, which in turn causes fluctuation in the threshold voltage. The threshold voltage is the gate voltage at which a MOSFET device turns on.

These fluctuations cause mismatches in inverters and NFETs in SRAMS and result in variability of the SRAM cell's characteristics, which degrades cell static noise margins. Static noise margins are defined as a minimum static noise voltage required to flip the state of the SRAM cell during a read access.

Therefore, a need exists for a structure and method, which reduces or eliminates gate leakage and threshold voltage fluctuation in SRAM cells in both idle and active modes.

SUMMARY OF THE INVENTION

A memory device has a memory cell including a plurality of active devices, which can be switched on by an applied threshold voltage. A power line is coupled to at least one storage node by one of the active devices. One other of the active devices couples a virtual ground to the storage node. Potentials of the power line and the virtual ground cause the plurality of active devices to be selectively operated in near subthreshold and/or superthreshold regimes in accordance with a mode of operation.

A method for operating a transregional static random access memory (SRAM) device includes providing a virtual ground in an SRAM cell, which is selectively decoupled from a global ground by a first device and providing a powerline which is capacitively coupled to a wordline such that power is boosted above a supply voltage when the wordline is activated. A voltage difference is maintained between the power line and one of the virtual ground and the ground to selectively operate devices of the SRAM in a near subthreshold or superthreshold regime in accordance with a mode of operation.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
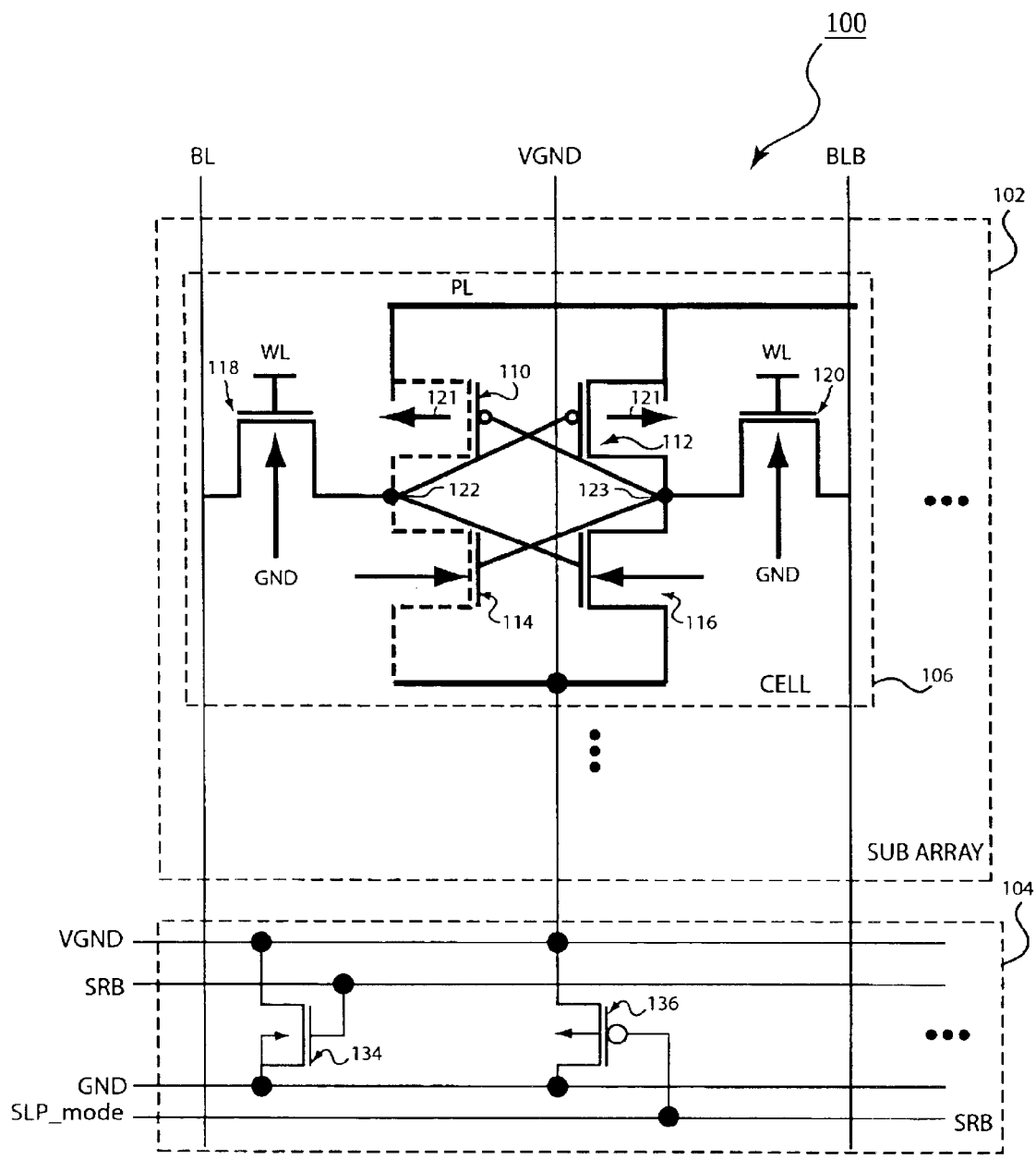
FIG. 1 is a schematic diagram of a circuit of one embodiment of the present invention.

The present invention provides an improved system and method to reduce or eliminate gate leakage in SRAM cell metal oxide semiconductor field effect transistors (MOSFETs) while providing a structure that is compatible with logic complementary metal oxide semiconductor (CMOS) processes and static random access memory (SRAM) processes.

The present invention provides a system and method to improve SRAM cell immunity to threshold voltage fluctuation. One aspect of the present invention employs transregional device operation to optimize the capabilities of active memory devices. In one embodiment, near subthreshold (Vdd less than or equal to about 2Vt) voltage operation is employed to store data reliably. This mode of operation further provides significantly reduced or eliminated gate leakage while simultaneously addressing performance, stability, leakage and logic supply voltage compatibility.

The present invention will now illustratively be described in terms of an SRAM device. However, the present invention is applicable to any semiconductor memory device. Referring now in detail to the figures in which like numerals represent the same or similar elements and initially to FIG. 1, an SRAM memory circuit 100 is illustratively shown having an array region 102 and a logic region 104. Array region comprising a plurality of SRAM cells 106.

Each cell 106 preferably includes six transistors 110, 112, 114, 116, 118 and 120. PFETs and NFETs may be switched as would be known to one skilled in the art. Transistors 110 and 112 may include PFETs having their source connected to a power line PL and their drains connected to respective storage nodes 122 (and 123). Transistors 114 and 116 may include NFETs connected between storage nodes 122 (and 123) and a virtual ground node VGND.

Transistors 118 and 120 have their gates connected to or part of a wordline WL and connect between a bitline BL or bitline bar BLB, respectively and their respective storage nodes 122 (and 123).

The present invention uses devices having a threshold voltage Vt. The present invention employs transregional device operation to optimize performance. This is achieved by strategically employing the use of subthreshold voltage or near subthreshold voltage storage maintenance and super-threshold read/write operations.

Power line PL is driven above a supply voltage, Vdd, by a wordline (WL) transition using a bootstrap action as will be described hereinbelow. The boost in power line PL may be given by the following relationship:

$$V_{boost} = Vdd(C_C/(C_C+C_M)) = (1+\gamma)Vdd = Vdd\gamma$$

where $C_c$ is the coupling capacitance between wordline WL and power line PL, and $C_M$ is the capacitance to ground of power line PL.

The "bootstrap action" of the present disclosure is enabled by placing power line PL in sufficient proximity of wordline WL to provide enough capacitive coupling to provide a voltage boost and/or restoration to Vdd, when appropriate, in the operation cycle of the memory cell. PFETs 110 and 112 ensure that power line PL restores to Vdd when wordline WL is deselected.

In addition, N-well contacts (shown as arrows 121) of SRAM cell 102 PFETs 110 and 112 are preferably connected to power line PL, e.g., in a bulk Si CMOS process. However, contacts 121 may be connected to Vdd. Advantageously, this avoids a transient forward bias current across PFET junctions when the PFETs are in a boosted state. These transients are avoided as well when restoring PL to Vdd during standby.

When power from power line PL is to be drawn, for example, when storage node 122 is to be driven to a "1" or high value, power line PL is driven higher than Vdd by conduction through PFET 110 or PFET 112 (for storage node 123). A stronger "high" or "1" at one of the storage nodes 122 (or 123) causes a stronger pull-down at NFET 114 or NFET 116. In this way, a larger electrical cell ratio and a larger cell read current are experienced and the benefits of the present disclosure are thereby realized. PL is therefore "boosted" above Vdd.

All transistors 110, 112, 114, 116, 118 and 120 shown in FIG. 1 may be operated in the superthreshold, subthreshold or near subthreshold regions to achieve optimal storage capabilities.

Figure 2:
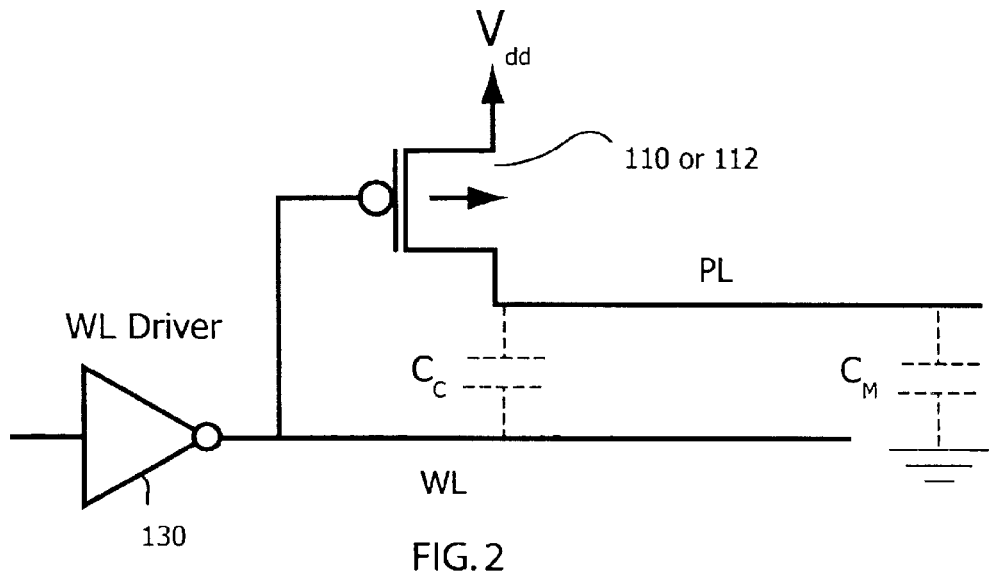
FIG. 2 is a schematic diagram of a model circuit showing a boost voltage in accordance with one embodiment of the present invention.

Referring to FIG. 2, a schematic diagram provides an illustrative model circuit to explain aspects of the present disclosure. A wordline driver or WL driver 130 drives a wordline WL. Wordline WL is connected to the gate of PFET 110 (or 112). When wordline WL is activated, PFET 110 is conducting thereby connecting power line PL to Vdd. Since wordline WL is in the vicinity of power line PL capacitive coupling ($C_c$) exists therebetween. In addition, a capacitive component ($C_M$) exists between power line PL and ground (GND). The capacitive components add in parallel to provide a current/voltage boost to Vdd (See e.g., FIG. 3).

Referring again to FIG. 1, in logic portion 104 of circuit 100, a virtual ground line VGND connects to VGND of array 102. VGND is coupled to global ground GND via one or more transistors 134 and 136. Transistor 134 may include an NFET which has its gate controlled by an SRB (self-reverse bias) signal. Transistor 136 may include a PFET which has its gate controlled by an SLP_mode ("sleep" mode) signal.

During idle mode, nodes 122 (and 123) store a one or a zero. In conventional systems, leakage through NFETs 114 and 116 to GND caused charge (ones) from storage nodes 122 (and 123) to discharge. By employing VGND at a value $V_{TP}$ greater than GND leakage is reduced or eliminated. Transistor 136 acts as a diode in preventing charge from going to GND. Hence, charge that builds up in VGND during idle mode increases the potential of VGND. When charge exceeds a threshold value, charge leaks through to GND, thereby self-limiting the amount of charge, which can build up on VGND.

Figure 3:
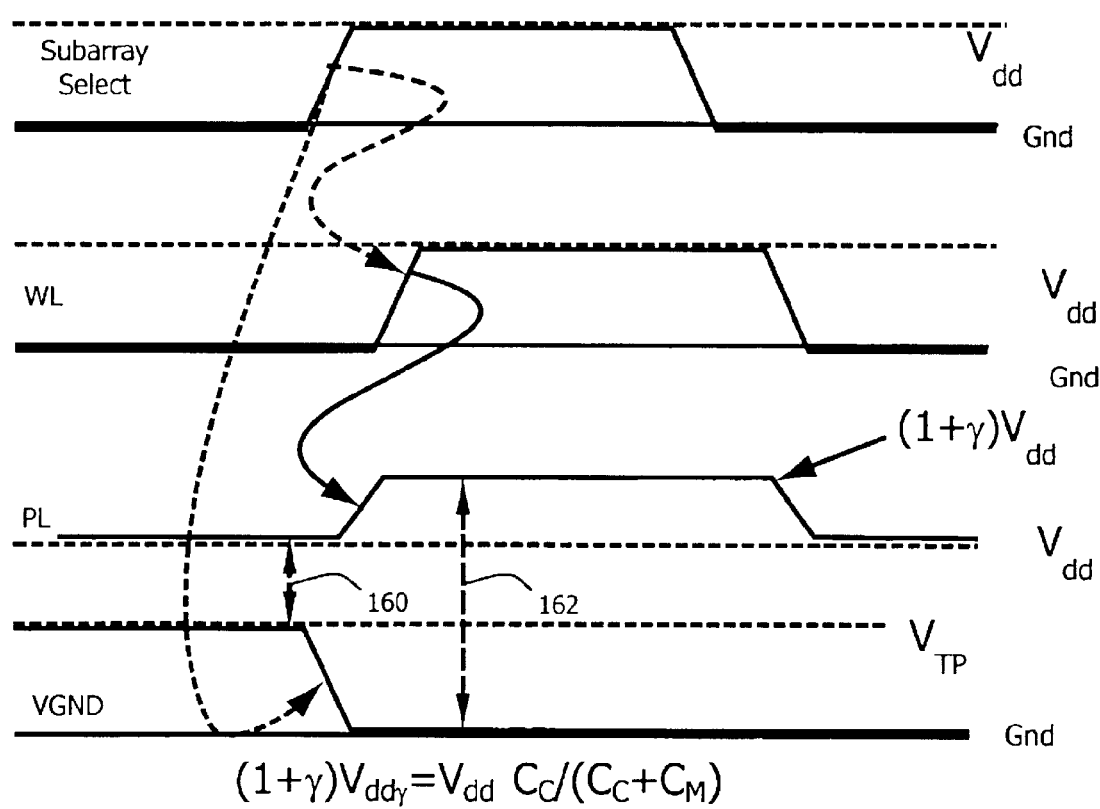
FIG. 3 is a timing diagram showing different modes of operation in accordance with the present invention.

Referring to FIG. 3 with continued reference to FIG. 1, a timing diagram is shown to illustratively demonstrate the present invention. In an idle or standby mode, data stored in storage nodes 122 (and 123) is maintained. Transistors 110, 112, 114 and 116 are operated in the near subthreshold region to maintain charge on storage nodes 122 (and 123).

During a read/write operation, SRB (subarray select) transitions from GND to Vdd. This triggers transistors 134 to conduct which drops VGND to GND potential. WL then rises to Vdd and bootstraps PL to supply Vddγ for writing to storage nodes 122 (and 123). In addition, access transistors, that is, those transistors used to write or read from storage nodes 122 (and 123) are run in a super-threshold regime, while unaccessed cells are maintained in a sub-threshold regime or near subthreshold regime.

In idle mode, VGND is at $V_{TP}$ and PL is at Vdd. During cell access, PL rises to Vddγ (or (1+γ)Vdd) and VGND approaches ground potential (e.g., 3 mV–5 mV). Table 1 shows node voltages for different nodes in FIG. 1 to illustrate operation in accordance with an embodiment of the present invention. The values given in Table 1 are for illustrative purposes and may be modified based on the application and system constraints. For example, potentials of BL and BLB may have a value of Vdd in access or standby mode. In Table 1, ΔV=(1+γ)Vdd−GND.

TABLE 1

| NODE: | State During Standby | State During Read/Write Access |
|---|---|---|
| PL | Vdd | Vdd (1 + γ) |
| BL | ½ Vdd | ±1/2 Vdd |
| BLB | ½ Vdd | ±1/2 Vdd |
| Left Storage Node (122) | VGND ($V_{TP}$) or Vdd | ΔV or Vdd |
| Right Storage Node | Vdd or | Vdd or |

TABLE 1-continued

| NODE: | State During Standby | State During Read/Write Access |
|---|---|---|
| (123) | VGND (V$_{TP}$) | ΔV |
| VGND | V$_{TP}$ | Approximately GND (3–5 mV) |
| GND | 0 V | 0 V |
| SRB | GND (0 V) | Vdd |
| SLP_Mode | GND (0 V) | GND (0 V) |

In addition, transregional operation of cell transistors is employed to optimize the memory operations performed. Accessed cells 106 will be operated in the super-threshold region by applying a gate voltage above a threshold voltage (e.g., Vg>Vt) during read/write operations. In addition, to self-reversed biasing applied to unaccessed cells 106 in idle mode, transistors are maintained in a sub-threshold region or near subthreshold region (Vg≦2Vt) to reduce an amount of leakage current through the transistors during idle operations (maintenance of charges in storage cells 122).

As can be seen in FIG. 3, a voltage difference 160 of Vdd-VGND is maintained for idle or standby operations. This voltage difference Vdd-VGND for unaccessed cell operations is preferably less than about 2 times Vt (2Vt). In preferred embodiments, this difference is small to prevent tunneling effects and reduce conduction due to diffusion of charge through transistors of cell 106.

A voltage difference 162 achieved during accessed cell operations is Vddγ-GND. The voltage difference Vddγ-GND for unaccessed cell operations is preferably greater than about 3 times Vt (3Vt). This large boost of cell Vdd ensures stable cell access and proper amount of charge storage in storage cells 122 (and/or 123). After access operations, VGND is restored to V$_{TP}$ by cell array leakage.

The transregional semiconductor memory cells of the present invention use modified gate voltages to achieve transistors working in different conductive regimes so that performance and cell stability are achieved even at low power supply voltages. In one embodiment, cell power rails may be maintained approximately a threshold voltage apart driving the cell transistors into the near subthreshold region where absence of an inversion layer carriers eliminates any tunneling currents across a gate oxide and reduces GIDL (Gate-Induced Drain Leakage). Lower voltage across the power rails also significantly reduces subthreshold leakage current due to lower DIBL (Drain Induced Barrier Lowering). Data stored by the SRAM cell in the near subthreshold region is more immune to Vt variations due to a much lower sensitivity to Static Noise Margin (SNM) to Vt variations, both systemic and random Vt fluctuations.

It is noted that during access operations all of the transistors in the SRAM cell need not be operated in the superthreshold region. Instead only the conducting transistors being employed to read/write to the storage nodes need to be operated in the superthreshold region.

Figure 4:
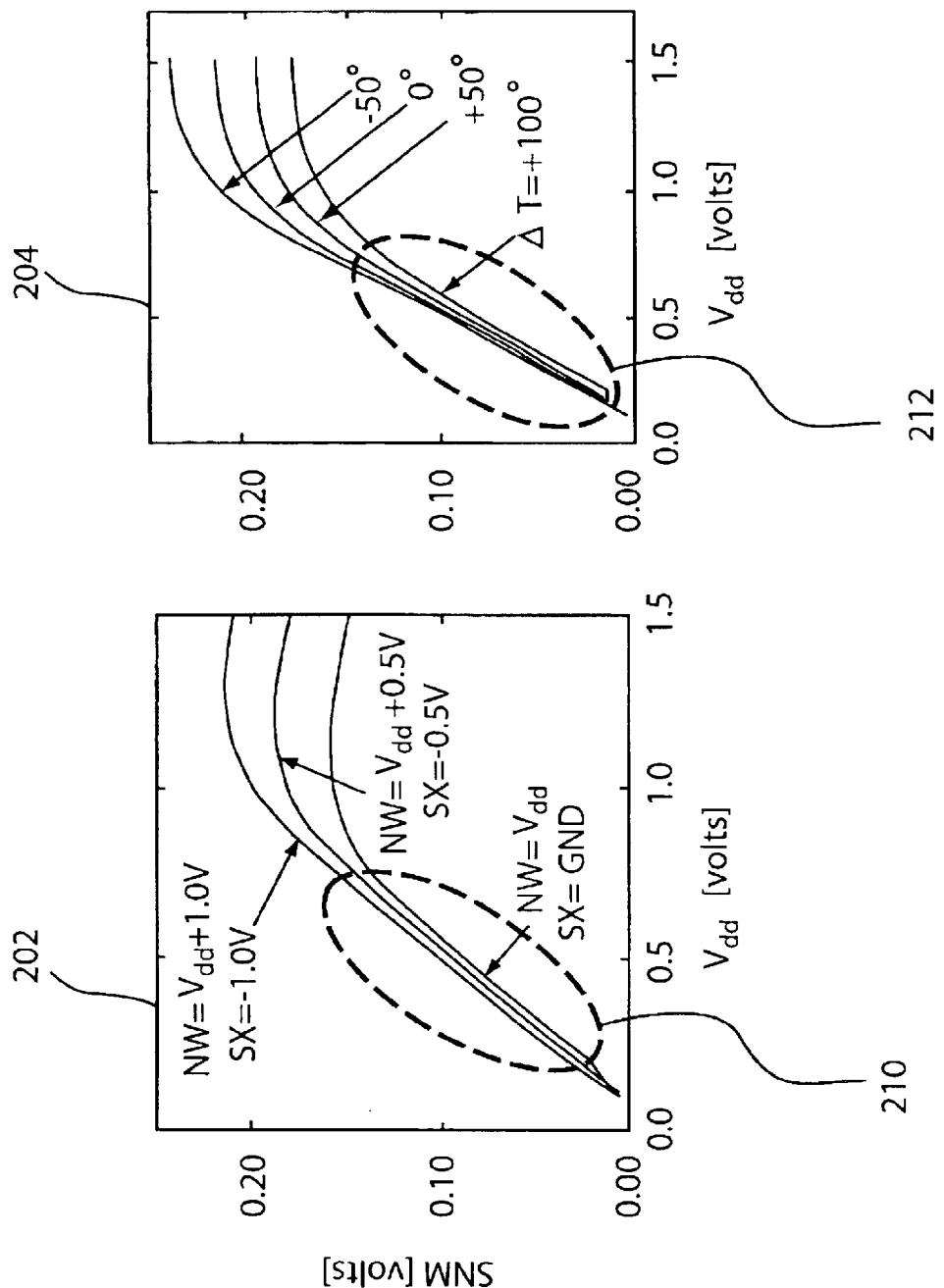
FIG. 4 shows graphs of static noise margin (SNM) versus supply voltage (Vdd) for devices operating in a near sub-threshold region.

Referring to FIG. 4, graph 202 shows SMN versus Vdd curves for:

NW=Vdd+1.0 V; Vdd+0.5 V; Vdd and

SX=−1.0 V; −0.5 V and GND, respectively.

NW is short for N-well (or body terminal for PFET devices) and SX is short for "substrate" for NFET devices. This terminology evolved from the Bulk Si technologies but carries through to silicon-on-insulator (SOI) as well even though there is no "substrate" connection. In the case of SOI, SX refers to a body contact in the NFET device when such is available.

Graph 204 shows SNM versus Vdd over a range of operating temperatures 100, 50, 0 and −50 degrees C. Both graphs indicate a dotted region.

Dotted regions 210 and 212 indicate a near subthreshold operating region as described above. This region includes Vdd less than or equal to about 2 Vt. This region includes the subthreshold region Vdd<Vt as well. As shown in graphs 202 and 204, the near subthreshold region may extend beyond 2Vt and coincides with a point where the curves of graphs 202 and 204 begin to noticeably diverge away from each other but before they begin to level off to an SNM value.

Having described preferred embodiments of a method and structure for reducing gate leakage and threshold voltage fluctuation in memory cells (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A memory device comprising:
   a memory cell including a plurality of active devices, which can be switched on by an applied threshold voltage;
   a power line coupled to at least one storage node by at least one of the active devices; and
   a virtual ground coupled to the at least one storage node by at least one other of the active devices;
   wherein potentials of the power line and the virtual ground cause the plurality of active devices to be selectively operated in near subthreshold and/or super-threshold regimes in accordance with a mode of operation.

2. The device as recited in claim 1, wherein the mode of operation includes one of a standby mode and an access mode.

3. The device as recited in claim 2, wherein the virtual ground is de-coupled from a global ground through a first device such that cell leakage from the cell raises the potential of the virtual ground during standby mode to reduce storage node leakage.

4. The device as recited in claim 2, wherein the virtual ground is connected to a global ground through a first device to increase a difference in potential during access mode operations.

5. The device as recited in claim 1, wherein the power line is boosted above a supply voltage by capacitive coupling to a wordline.

6. The device as recited in claim 5, wherein the mode of operation includes an access mode and a voltage difference between a boosted supply voltage and a ground is greater than or equal to about 3 times a threshold voltage of the active devices.

7. The device as recited in claim 1, wherein the mode of operation includes a standby mode and a voltage difference between a supply voltage and the virtual ground is less than or equal to about two times a threshold voltage of the active devices.

8. The device as recited in claim 1, wherein the device includes a static random access memory.

9. The device as recited in claim 1, wherein the plurality of actives devices includes six transistors.

10. The device as recited in claim 1, wherein near subthreshold operation includes subthreshold operation.

11. A static random access memory device comprising:
a memory cell including a plurality of transistors, which are active with an applied threshold voltage;
a power line coupled to storage nodes by first transistors; and
a virtual ground coupled to the storage nodes by second transistors;
wherein potentials of the power line and the virtual ground selectively cause the plurality of transistors to be operated in near subthreshold and/or superthreshold regimes in accordance with a mode of operation.

12. The device as recited in claim 11, wherein the mode of operation includes one of a standby mode and an access mode.

13. The device as recited in claim 12, wherein the virtual ground is de-coupled from a global ground through a third device such that cell leakage from the cell raises the potential of the virtual ground during standby mode to reduce storage node leakage.

14. The device as recited in claim 12, wherein the virtual ground is connected to a global ground through a fourth device to increase a difference in potential during access mode operations.

15. The device as recited in claim 11, wherein the power line is boosted above a supply voltage by capacitive coupling to a wordline.

16. The device as recited in claim 15, wherein the mode of operation includes an access mode and a voltage difference between a boosted supply voltage and a ground is greater than or equal to about 3 times a threshold voltage of the plurality of transistors.

17. The device as recited in claim 11, wherein the mode of operation includes a standby mode and a voltage difference between a supply voltage and the virtual ground is less than or equal to about two times a threshold voltage of the plurality of transistors.

18. The device as recited in claim 11, wherein the plurality of transistors includes six transistors.

19. The device as recited in claim 11, wherein near subthreshold operation includes subthreshold operation.

20. A method for operating a transregional static random access memory (SRAM) device, comprising the steps of:
providing a virtual ground in an SRAM cell, which is selectively decoupled from a global ground by a first device;
providing a powerline which is capacitively coupled to a wordline such that power is boosted above a supply voltage when the wordline is activated; and
maintaining a voltage difference between the power line and one of the virtual ground and the global ground to selectively operate the SRAM device in a near subthreshold or superthreshold regime in accordance with a mode of operation.

21. The method as recited in claim 20, wherein the step of maintaining includes the step of maintaining a voltage difference between the power line and the virtual ground of less than or equal to about 2 times the threshold voltage of the devices during a standby mode.

22. The method as recited in claim 20, wherein the step of maintaining includes the step of maintaining a voltage difference between the power line and the global ground of greater than or equal to about 3 times the threshold voltage of the devices in an access mode.

23. The method as recited in claim 20, wherein the step of providing a virtual ground in an SRAM cell which is selectively decoupled from a global ground by a first device includes coupling the global ground to the virtual ground during an access mode.

24. The method as recited in claim 20, wherein the step of providing a virtual ground in an SRAM cell, which is selectively decoupled from a global ground by a first device, includes restoring the virtual ground to a nonzero potential during a standby mode.

25. The method as recited in claim 20, wherein the near subthreshold operation of the devices is associated with a standby mode and a superthreshold operation of the devices is associated with an access mode.

* * * * *